United States Patent
Carroll et al.

(10) Patent No.: US 6,194,750 B1
(45) Date of Patent: Feb. 27, 2001

(54) INTEGRATED CIRCUIT COMPRISING MEANS FOR HIGH FREQUENCY SIGNAL TRANSMISSION

(75) Inventors: Michael Scott Carroll; Tony Georgiev Ivanov, both of Orlando, FL (US); Samuel Suresh Martin, Gillette, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/243,377

(22) Filed: Feb. 1, 1999

(51) Int. Cl.[7] ........................... H01L 29/80; H01L 31/112
(52) U.S. Cl. ........................... 257/275; 257/630; 257/652
(58) Field of Search .................................. 257/275, 630, 257/652, 776

(56) References Cited

U.S. PATENT DOCUMENTS

| | | |
|---|---|---|
| 4,727,319 | 2/1988 | Shahriary . |
| 5,384,486 | * 1/1995 | Konno . |
| 5,391,914 | * 2/1995 | Sullivan et al. . |
| 5,565,788 | 10/1996 | Burr et al. . |
| 5,594,393 | 1/1997 | Bischof . |
| 5,634,208 | 5/1997 | Nishikawa et al. . |
| 5,874,778 | * 2/1999 | Bhattacharyya et al. . |
| 5,959,342 | * 9/1999 | Shibb . |
| 6,043,556 | * 3/2000 | Tomie . |

OTHER PUBLICATIONS

C. Wan et al., "A New Technique for In–Fixture Calibration Using Standards of Constant Length," IEEE Transactions on Microwave Theory, vol. 46, No. 9, Sept 1998, pp. 1318–1320.

* cited by examiner

Primary Examiner—Stephen D. Meier
(74) Attorney, Agent, or Firm—DeMont & Breyer, LLC; Jason Paul DeMont; Wayne S. Breyer

(57) ABSTRACT

An integrated circuit is disclosed that comprises structures that confine, shield and/or manipulate the electric fields generated within the integrated circuit so as to improve the performance of the integrated circuit. Such structures include, but are not limited to, transmission lines, capacitors, inductors, filters, and couplers. Although embodiments of the present invention are advantageous for use on many integrated circuits, they are particularly well suited for use with integrated circuits that are disposed on conductive substrates and that operate at high frequencies.

An illustrative embodiment of the present invention comprises: an integrated circuit comprising: a first lead and a second lead that are made from a first conductive layer; a substrate; a first plate and a second plate that are made from a second conductive layer; wherein said first plate is sandwiched between and electrically insulated from said first lead and said substrate, said second plate is sandwiched between and electrically insulated from said second lead and said substrate, and said first plate and said second plate are electrically connected.

7 Claims, 10 Drawing Sheets

*FIG. 1*
TOP VIEW
100

*FIG. 2*
SIDE VIEW ALONG CUT I

*FIG. 3*
END VIEW ALONG CUT II

FIG. 4

FIG. 5
END VIEW ALONG CUT IV

FIG. 6
END VIEW ALONG CUT III

*FIG. 7*

TOP VIEW

300

FIG. 8
SIDE VIEW ALONG CUT V

FIG. 9
END VIEW ALONG CUT VI

FIG. 10

FIG. 11
SIDE VIEW ALONG CUT VIII

FIG. 12
END VIEW ALONG CUT IX

FIG. 13
TOP VIEW

FIG. 14
SIDE VIEW

FIG. 15

END VIEW

INTEGRATED CIRCUIT COMPRISING MEANS FOR HIGH FREQUENCY SIGNAL TRANSMISSION

FIELD OF THE INVENTION

The present invention relates to integrated circuits in general, and, more particularly, to integrated circuits that comprise structures (e.g., transmission lines, inductors, capacitors, etc.) that manipulate high frequency signals.

BACKGROUND OF THE INVENTION

An integrated circuit as formed on a semiconductor wafer typically comprises a variety of basic electrical components (e.g., transistors, diodes, capacitors, etc.) and leads for conducting signals to and from those components. When such an integrated circuit operates at a high frequency, the degree of parasitic capacitance and inductance and signal cross-talk that is induced can severely hinder the performance of the integrated circuit. This is particularly true if the integrated circuit has a conductive substrate.

Therefore, the need exists for an improved integrated circuit that can operate at a high frequency without the performance drawbacks associated with integrated circuits in the prior art.

SUMMARY OF THE INVENTION

Some embodiments of the present invention are capable of improving the performance of integrated circuits without the costs and restrictions associated with techniques in the prior art. In particular, some embodiments of the present invention comprise structures that confine, shield and/or manipulate the electric fields that are generated by signals within the integrated circuit so as to improve the performance of the integrated circuit. Although embodiments of the present invention are advantageous for use on many integrated circuits, they are particularly well suited for use with integrated circuits that are disposed on conductive substrates and that operate at high frequencies.

In some of the illustrative embodiments described below, conductive elements are used to form structures near and/or around the leads to and from devices. When the structures are grounded, they function to (at least) partially shield the leads in a manner that is analogous to stripline, microstrip and coaxial cable. Because the electric fields emanating from the leads terminate in the grounded structures and not in the substrate of the integrated circuit, the severity of parasitic capacitance and inductance and signal cross-talk can be substantially mitigated. This, in turn, improves the signal-to-noise. ratio of the signals on the leads and enables the integrated circuit to perform better at high frequency.

In some embodiments of the present invention, passive high-frequency signal components (e.g., couplers, filters, capacitors, etc.) are formed as part of an integrated circuit. For example, in one of the illustrative embodiments of the present invention described below, an inductor is created with the shape of a helix such that the axis of the helix is parallel to the plane in which the substrate lies. This enables inductors with large inductance to be created on an integrated circuit with a small cost in terms of real estate.

An illustrative embodiment of the present invention comprises: an integrated circuit comprising: a first lead and a second lead that are made from a first conductive layer; a substrate; a first plate and a second plate that are made from a second conductive layer; wherein said first plate is sandwiched between and electrically insulated from said first lead and said substrate, said second plate is sandwiched between and electrically insulated from said second lead and said substrate, and said first plate and said second plate are electrically connected.

DETAILED DESCRIPTION

All of the illustrative embodiments described herein and depicted in the accompanying drawings are associated with integrated circuits that comprise two or more conductive layers. For the purposes of this specification, an "integrated circuit" is defined as a slice or chip of material on which is etched or deposited electronic components or interconnections or both. Also for the purposes of this specification, a "conductive layer" is defined as a layer of material or materials that have a substantially lower resistivity than its surrounding layers. Furthermore, it should be noted that a conductive layer is not necessarily limited to elemental metal layers but can, depending on the relative resistivity of the surrounding layers, also comprise a highly-doped semiconductor material, a conductive oxide, a nitride or other conductive compound. FIGS. 1–6 depict illustrative embodiments of the present invention that comprise two conductive layers, and FIGS. 7–17 depict illustrative embodiments of the present invention that comprise three conductive layers.

Figure 1:
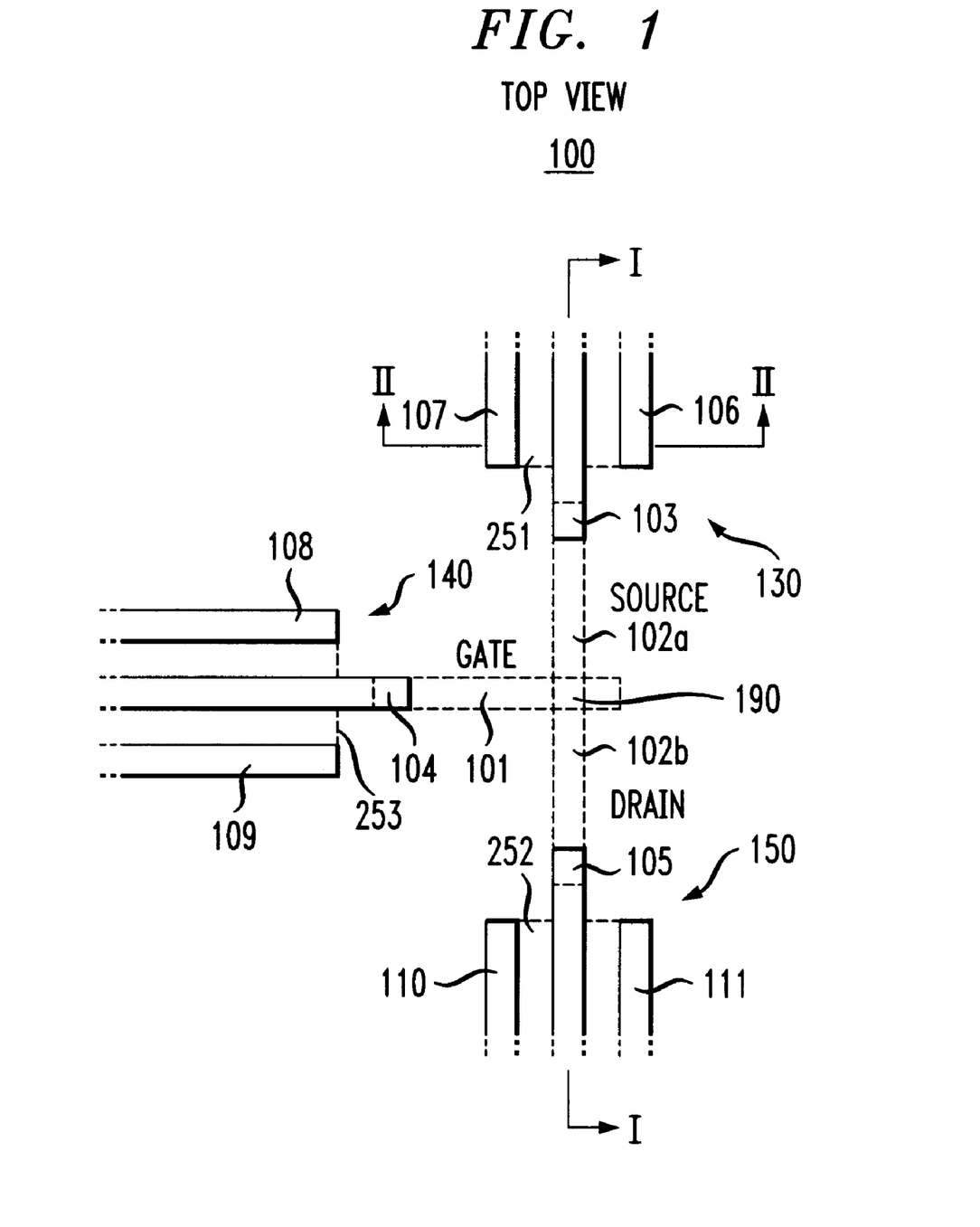
FIG. 1 depicts a plan view of a first embodiment of an integrated circuit in accordance with an illustrative embodiment of the present invention.
Figure 2:
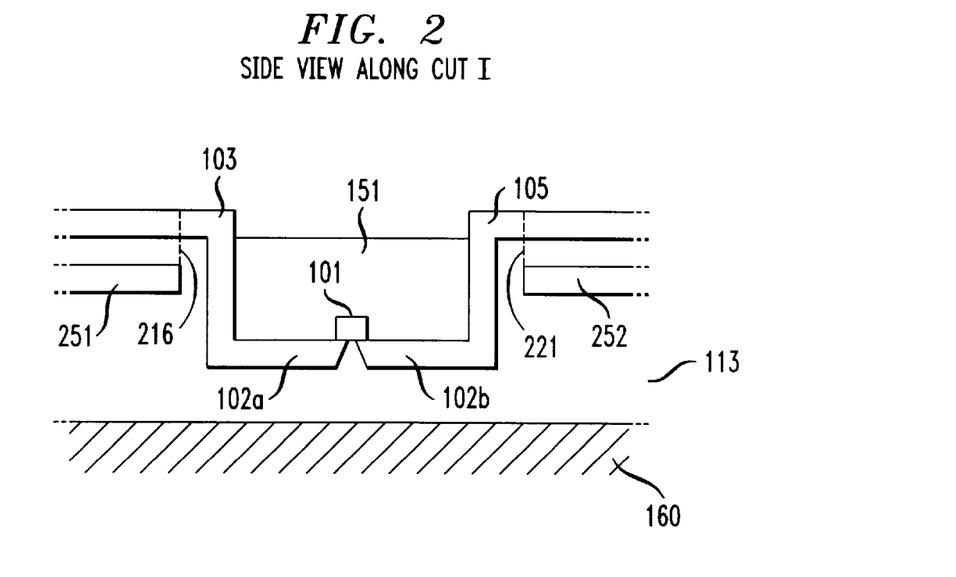
FIG. 2 depicts a cross-sectional elevation of the integrated circuit of FIG. 1 along the line I—I in FIG. 1.
Figure 3:
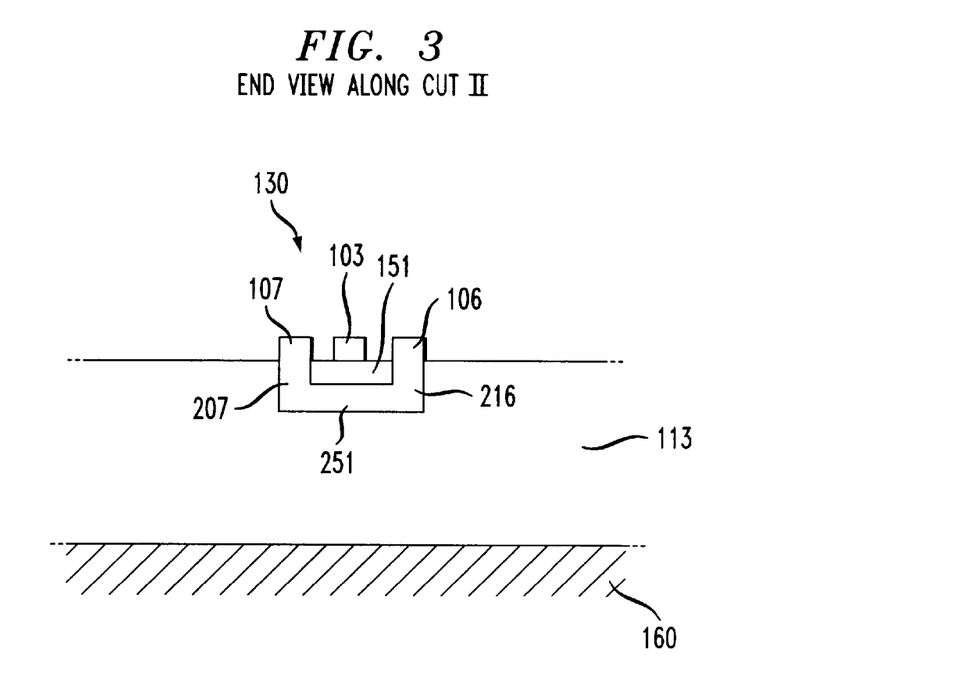
FIG. 3 depicts a cross-sectional elevation of the integrated circuit of FIG. 1 along the line II—II in FIG. 1.

FIGS. 1–3 depict a first embodiment of an article comprising integrated circuit 100 in accordance with the present invention. FIG. 1 depicts a plan view of integrated circuit 100, FIG. 2 depicts a cross-sectional view of integrated circuit 100 along the line I—I of FIG. 1 and FIG. 3 depicts a cross-sectional view of integrated circuit 100 along the line II—II of FIG. 1.

FIG. 1 depicts a plan view of a transistor formed on an integrated circuit and its three leads. It should be understood that the illustrative embodiments depicted in FIGS. 1–12 are directed to the leads that interconnect various devices (e.g., transistors, etc.) and the structures near and/or around those leads. The particulars of such devices form no part of the present invention, and, therefore, are not addressed herein.

As depicted in FIG. 1, article 100 comprises three leads 103, 104 and 105 that are respectively connected to source 102A, gate 101 and drain 102B of transistor 190. Those three leads are patterned from, or otherwise comprise a first conductive layer. Between each of leads 103, 104 and 105 and underlying substrate 160 is a conductive "trough." In particular, trough 130 is "sandwiched" or interposed between lead 103 and substrate 160; trough 140 is sandwiched between lead 104 and substrate 160, and trough 150 is sandwiched between lead 105 and substrate 160. Substrate layer 160, as well as any other substrate layer referenced in this Detailed Description, is can be conductive; however, such conductivity is not required to practice the present invention.

Each of illustrative troughs 130, 140 and 150 are identically configured with rims at the "mouth" of the trough, a bottom that is illustratively configured as a plate, and, optionally, side "walls" that electrically connect the rim to the bottom. FIG. 3 depicts an end cross-sectional view of trough 130, showing plate 251 defining the bottom of the trough and side walls 216 and 217 electrically connecting plate 251 to rims 106 and 107. The bottom of each trough is patterned from, or otherwise comprises, a second conductive layer.

In the present embodiment, side walls 216 and 217 of trough 130 are depicted as vertically-disposed plate-like or solid members. In other embodiments, such side walls are not vertical, but are skewed outwardly from bottom to top such that the "opening" of such a trough at the relative elevation of the rims (e.g., rims 106 and 107) is wider than the plate (e.g., plate 251) defining the bottom of the trough. In other embodiments, the side walls are skewed inwardly from bottom to top.

A first layer of electrically-insulating material is disposed between leads 103, 104 and 105 and the bottom (i.e., plates 251, 253 and 252) of respective troughs 130, 140 and 150. Similarly, a second layer of electrically-insulating material is disposed between plates 251, 253 and 252 and substrate 160. For pedagogical purposes, both the first and second insulating layers, as well as other layers from which active components are formed, are not individually depicted in FIGS. 2 and 3, but are rather collectively represented by reference numeral 113. The substrate underlying those layers is referred to by reference numeral 160.

Leads 103, 104 and 105 exit respective troughs 130, 140 and 150 to electrically connect with the source, gate and drain of the transistor. In FIG. 2, leads 103 and 105 are shown changing elevation to connect with respective source 102A and drain 102B.

Advantageously, troughs 130, 140 and 150 are connected to ground while the embodiment is in operation, which shields signals on leads 103, 104 and 105 and reduces the appearance of parasitics. This is particularly true when substrate 160 is conductive and the signals are at high frequency.

Figure 4:
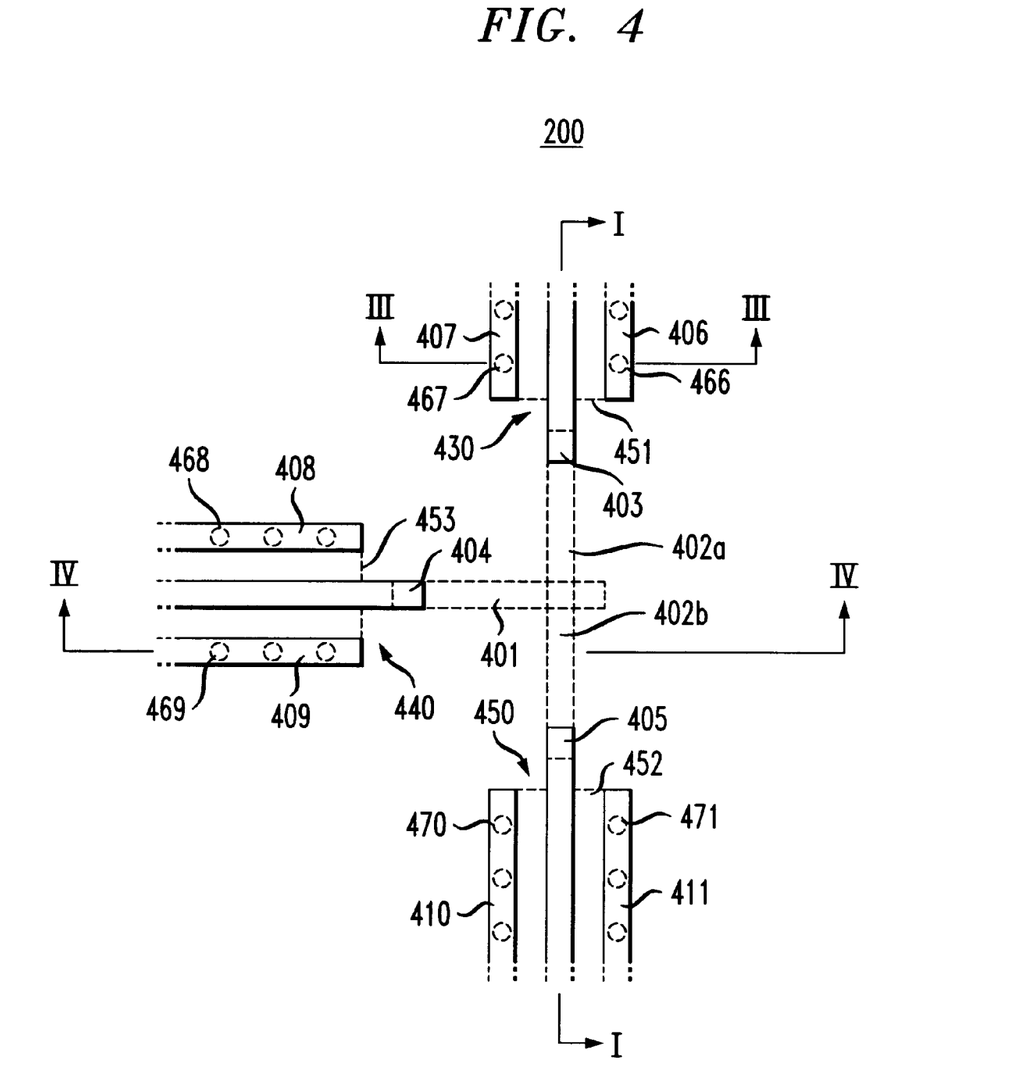
FIG. 4 depicts a plan view of a second embodiment of an integrated circuit in accordance with an illustrative embodiment of the present invention.
Figure 5:
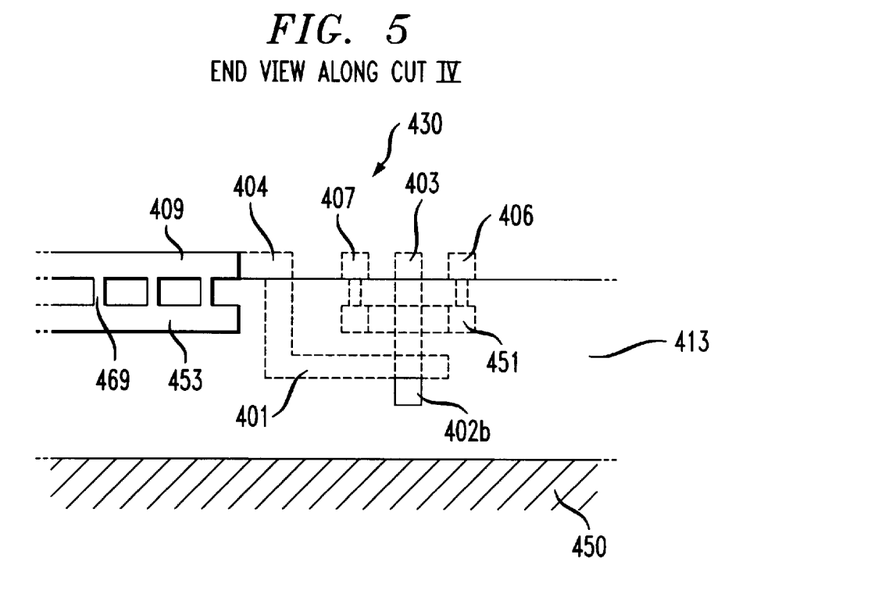
FIG. 5 depicts a cross-sectional elevation of the integrated circuit of FIG. 4 along the line III—III in FIG. 4.
Figure 6:
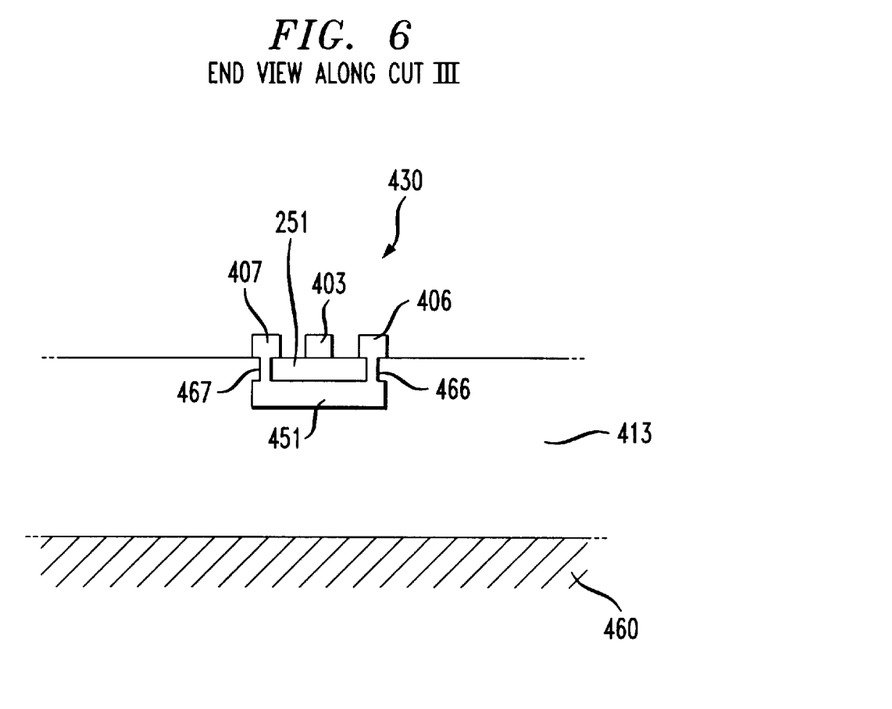
FIG. 6 depicts a cross-sectional elevation of the integrated circuit of FIG. 4 along the line IV—IV in FIG. 4.

FIGS. 4–6 depict a second embodiment of an article comprising integrated circuit 200 in accordance with the present invention. FIG. 4 depicts a plan view of integrated circuit 200, FIG. 5 depicts a cross-sectional view of integrated circuit 200 along the line IV—IV of FIG. 4 and FIG. 5 depicts a cross-sectional view of integrated circuit 200 along the line III—III of FIG. 4.

Integrated circuit 200 is arranged similarly to integrated circuit 100 in that both embodiments include troughs. The structure of the troughs of integrated circuit 200 is, however, somewhat different than that of troughs 130, 140 and 150 of integrated circuit 100. In particular, instead of having the "solid" plate-like side walls (e.g., side walls 216 and 217 of trough 130) of integrated circuit 100, the side "walls" of troughs 430, 440 and 450 are defined by plural conductive (e.g., metalized, etc.) vias.

Trough 430 thus comprises plate 451 defining a bottom, rims 406 and 407, and plural conductive vias 466 and 467. Trough 440 comprises plate 453 defining a bottom, rims 408 and 409, and plural conductive vias 468 and 469. And trough 450 comprises plate 452 defining a bottom, rims 410 and 411, and plural conductive vias 470 and 471. "End-on" views of trough 430 are afforded by FIGS. 5 and 6.

A first layer of electrically-insulating material is disposed between leads 403, 404 and 405 and the bottom (i.e., plates 451, 453 and 452) of respective troughs 430, 440 and 450. Similarly, a second layer of electrically-insulating material is disposed between plates 451, 453 and 452 and underlying substrate 460. Such first and second layers of electrically-insulating material, which are not individually depicted in FIGS. 5 and 6, are collectively represented by reference numeral 413.

As will be clear to those skilled in the art, the maximum allowable distance between adjacent vias is a function of the wavelength of the highest frequency signal whose field is to be confined.

Figure 7:
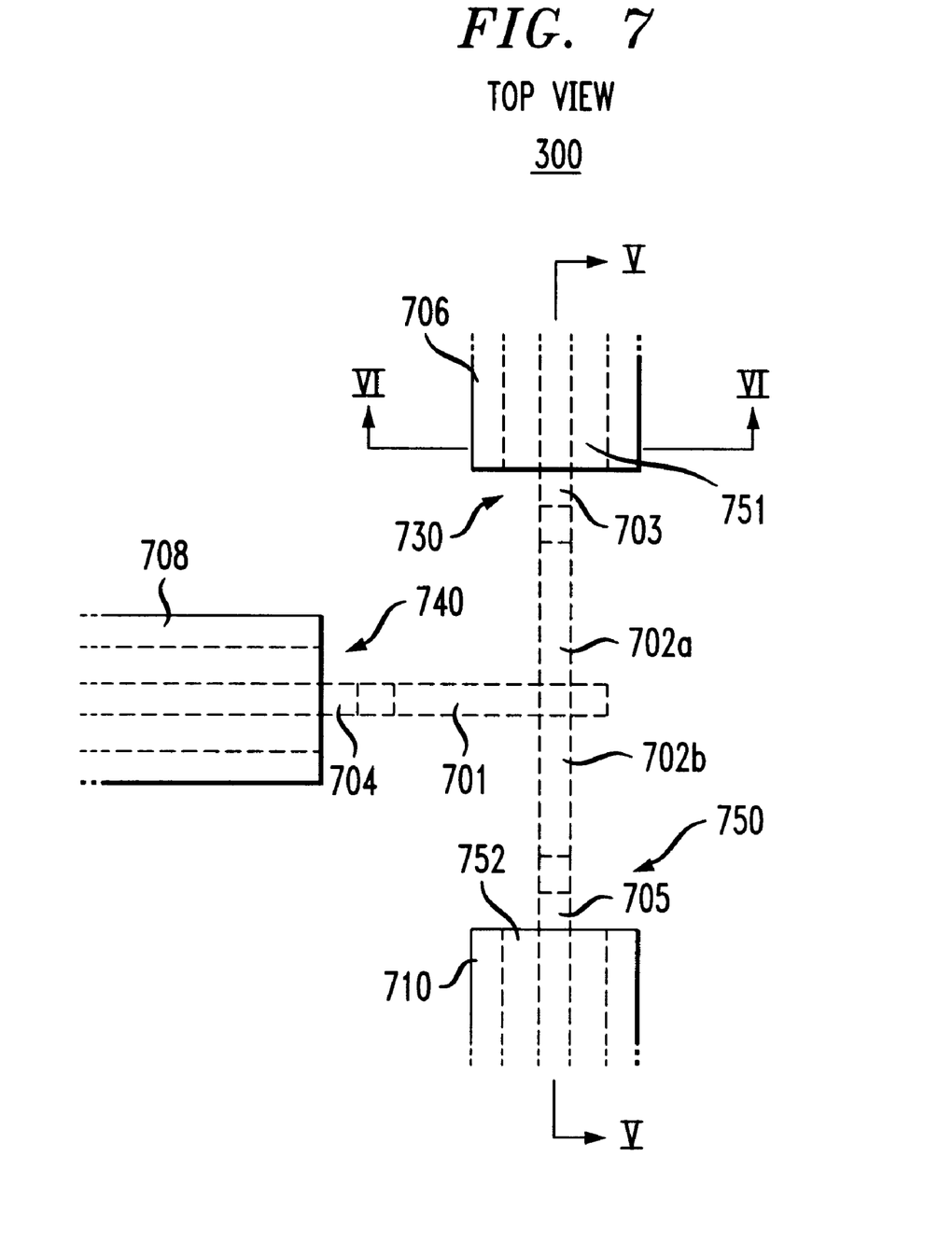
FIG. 7 depicts a plan view of a third embodiment of an integrated circuit in accordance with an illustrative embodiment of the present invention.
Figure 8:
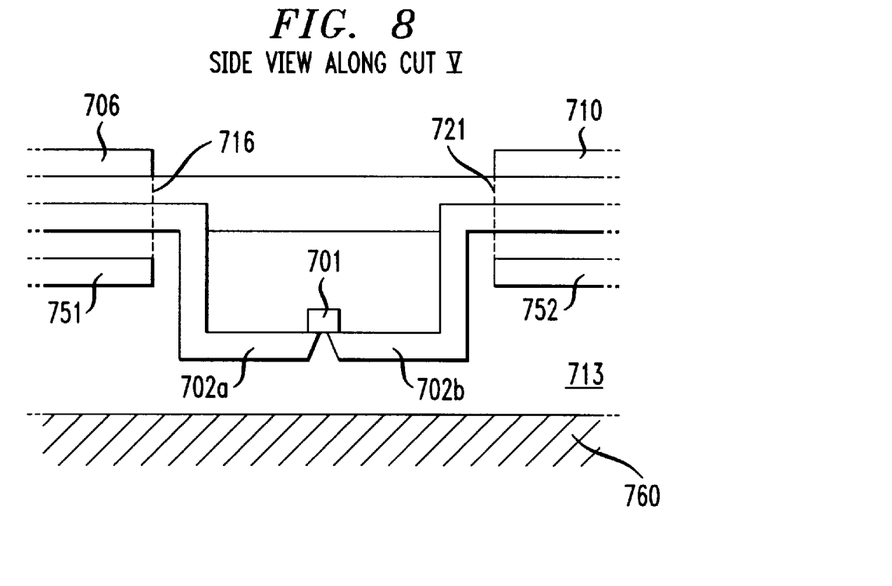
FIG. 8 depicts a cross-sectional elevation of the integrated circuit of FIG. 7 along the line V—V in FIG. 7.
Figure 9:
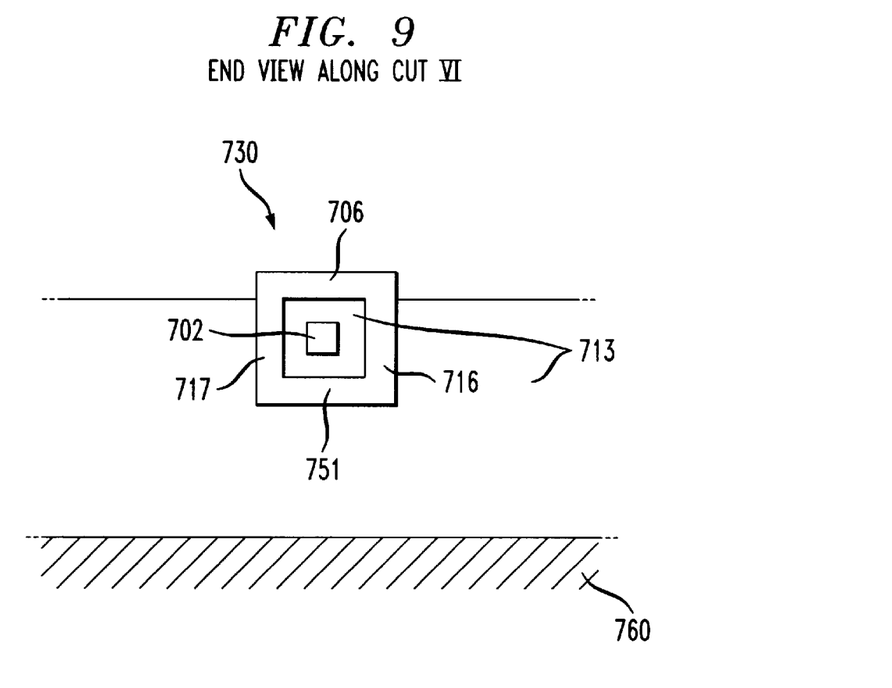
FIG. 9 depicts a cross-sectional elevation of the integrated circuit of FIG. 7 along the line VI—VI in FIG. 7.

FIGS. 7–9 depict a third embodiment of an article comprising an integrated circuit 300 in accordance with the present teachings. FIG. 7 depicts a plan view of integrated circuit 300, FIG. 8 depicts a cross-sectional view of integrated circuit 200 along the line V—V of FIG. 7 and FIG. 9 depicts a cross-sectional view of integrated circuit 300 along the line VI—VI of FIG. 7.

Unlike the previously-described embodiments, integrated circuit 300 incorporates three conductive layers. Relative to embodiments having two conductive layers, integrated circuit 300 having three conductive layers arranged in accordance with the present teachings, advantageously provides further confinement of electric fields emanating from signal lines connected, for example, to the gate, source and drain of a transistor in integrated circuit 300.

Integrated circuit 300 comprises leads 703, 704 and 705 that are electrically connected to source 702A, gate 701 and drain 702B, respectively. Leads 703, 704 and 705 are substantially surrounded or encased by respective conductive ducts 730, 740 and 750. Each of the conductive ducts in integrated circuit 300 function in the same manner as coaxial cable and are similar to the conductive troughs (e.g., troughs 130, 140 and 150) of integrated circuit 100. In addition to a bottom and sides, integrated circuit 300 has a top. In particular, as depicted in FIG. 8, duct 730 comprises plate 751 defining a bottom of the duct, side walls 716 and 717, and plate 706 defining a top of the duct. Ducts 740 and 750 are similarly constructed, with respective (bottom) plates 753 and 752 and respective (top) plates 708 and 710. The side walls of ducts 740 and 750 are not shown, with the exception of side wall 721 of duct 750, which is depicted in FIG. 8.

A first layer of electrically-insulating material is disposed between a signal lead (e.g., lead 703) and the "overlying" plate (e.g., top plate 706 of duct 730). A second layer of electrically-insulating material is disposed between the signal lead (e.g., lead 703) and the "underlying" plate (e.g., bottom plate 751 of duct 730). And a third layer of electrically-insulating material is disposed between the bottom of the duct (e.g., bottom plate 751 of duct 730) and an underlying substrate 760. Such first, second and third layers of electrically-insulating material, which are not individually depicted in FIGS. 8 and 9, are collectively represented by reference numeral 713.

The conductive ducts of integrated circuit 300 will typically provide more shielding than the troughs of integrated circuits 100 and 200, and, therefore, will typically provide a better performance increase than will the troughs of integrated circuits 100 and 200.

Figure 10:
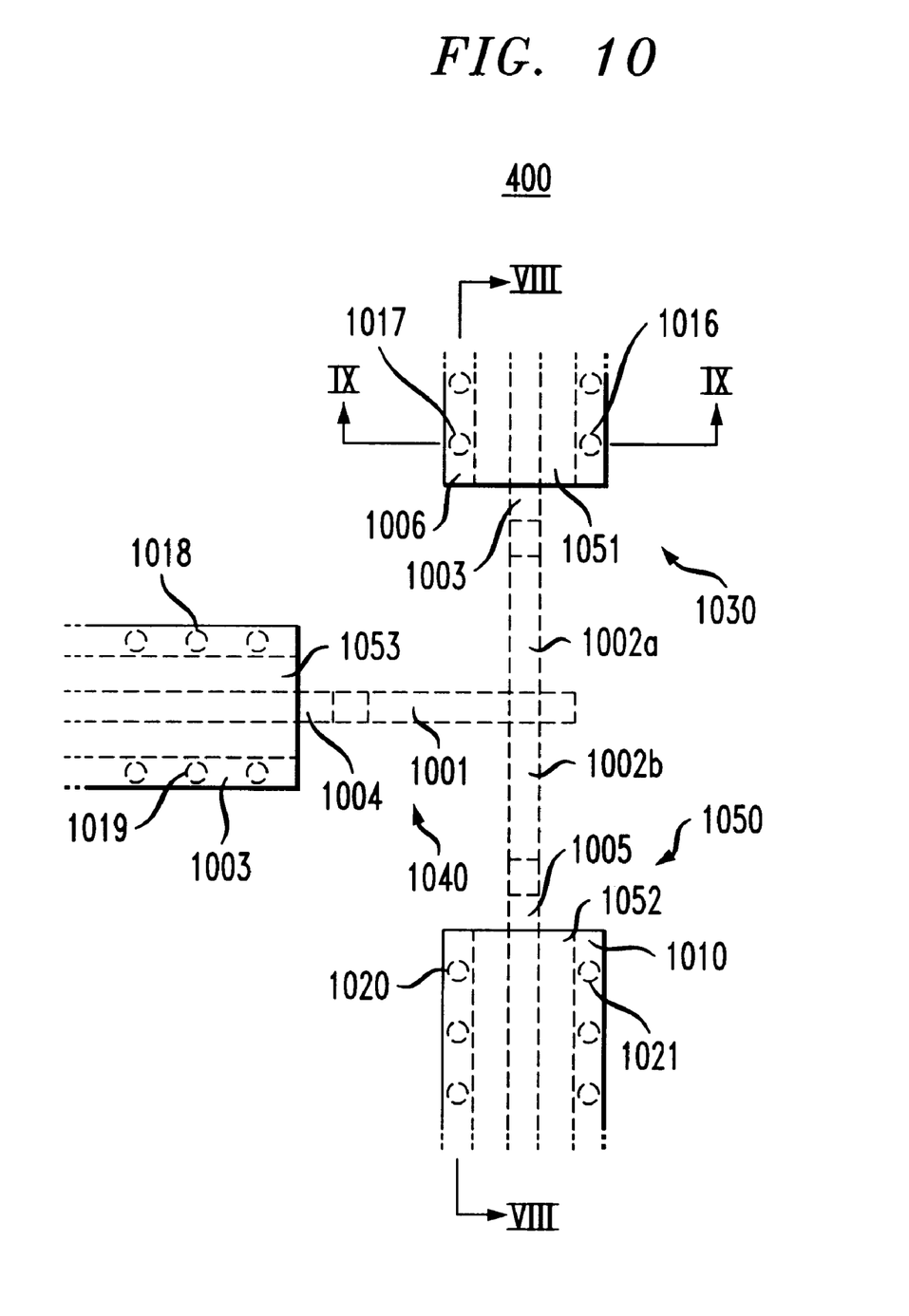
FIG. 10 depicts a plan view of a fourth embodiment of an integrated circuit in accordance with an illustrative embodiment of the present invention.
Figure 11:
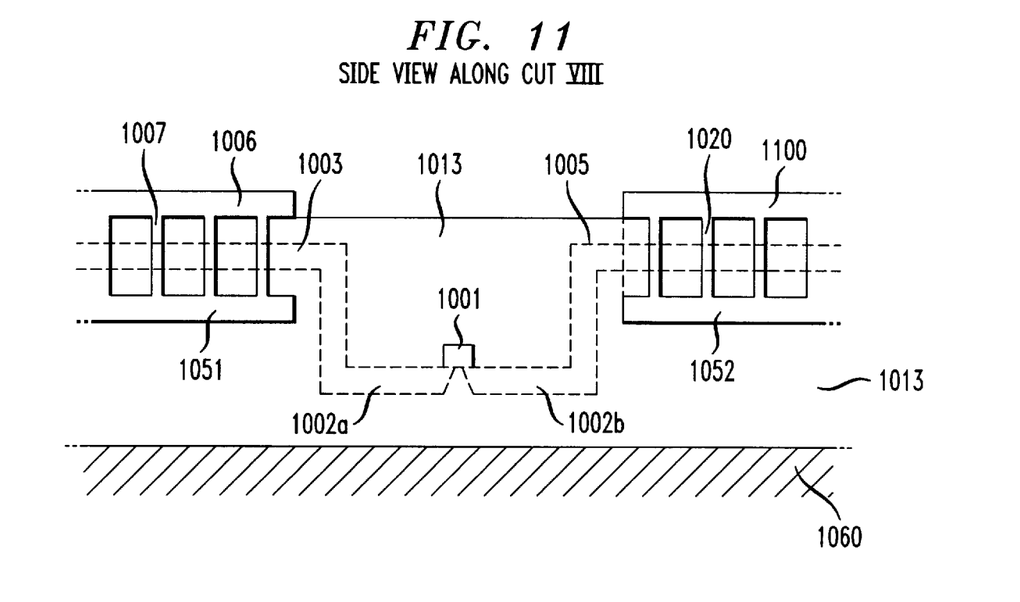
FIG. 11 depicts a cross-sectional elevation of the integrated circuit of FIG. 10 along the line VIII—VIII in FIG. 10.
Figure 12:
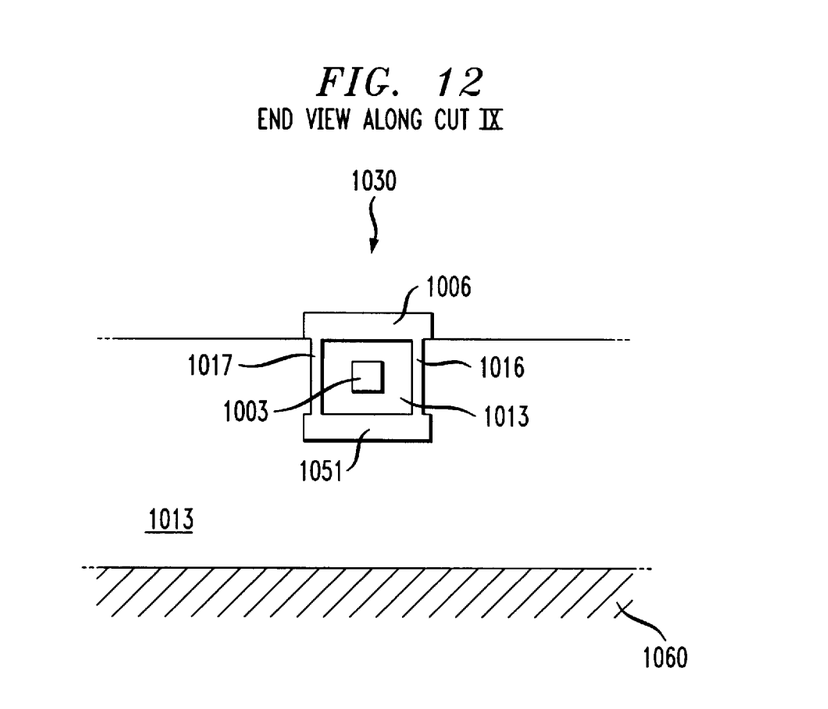
FIG. 12 depicts a cross-sectional elevation of the integrated circuit of FIG. 10 along the line IX—IX in FIG. 10.

FIGS. 10–12 depict a fourth embodiment of an article comprising an integrated circuit 400 in accordance with the present teachings. FIG. 10 depicts a plan view of integrated circuit 400, FIG. 11 depicts a cross-sectional view of integrated circuit 400 along the line VIII—VIII of FIG. 10 and FIG. 12 depicts a cross-sectional view of integrated circuit 400 along the line IX—IX of FIG. 10.

Integrated circuit 400 is arranged similarly to integrated circuit 300, but the plate-like sides (e.g., sides 716 and 717 of duct 730) are replaced by "sides" that are defined by plural conductive (e.g., metalized) vias. For the purposes of the present description and the appended claims, a structure having plate-like side walls is referred to herein as a "duct," and a structure having plural-vias for "side walls" is referred to as a "cage."

Integrated circuit 400 comprises leads 1003, 1004 and 1005 that are electrically connected to source 1002A, gate 1001 and drain 1002B, respectively. Leads 1003, 1004 and 1005 are substantially surrounded or encased by respective conductive cages 1030, 1040 and 1050.

As depicted in FIG. 10, cage 1030 comprises plate 1051 defining a bottom of the cage, plural conductive vias 1016 and 1017 defining side walls, and plate 1006 defining a top of the cage. Cage 1040 comprises plate 1053 defining a bottom of the cage, plural conductive vias 1018 and 1019 defining side walls, and plate 1008 defining atop of the cage. Cage 1050 comprises plate 1052 defining a bottom of the cage, plural conductive vias 1020 and 1021 defining side walls, and plate 1010 defining a top of the cage. A cross sectional end view of cage 1030 is depicted in FIG. 12. That Figure shows signal lead 1003 disposed within cage 1030 that is defined by plates 1006 and 1051 on top and bottom, and plural conductive vias 1016 and 1017 on the sides.

A first layer of electrically-insulating material is disposed between a signal lead (e.g., lead 1003) and the "overlying" plate (e.g., top plate 1006 of cage 1030). A second layer of electrically-insulating material is disposed between the signal lead (e.g., lead 1003) and the "underlying" plate (e.g., bottom plate 1051 of cage 1030). And a third layer of electrically-insulating material is disposed between the bottom of the cage (e.g., bottom plate 1051 of cage 1030) and an underlying substrate 1060. Such first, second and third layers of electrically-insulating material, which are not individually depicted in FIGS. 11 and 12, are collectively represented by reference numeral 1013.

Beyond the ability of the present structures to improve integrated circuit operation as a result of decreased parasitics, the illustrative integrated circuit configurations described herein make possible the integration of passive components on conductive silicon substrates. The difficulties with monolithically integrating low-loss inductors on such conventional silicon substrates are well established, and as a result of these problems, inductors have typically been fabricated "off chip" and incorporated with ICs as part of a multi-chip module or implemented at the board level as discrete components. Both such approaches involve more assembly steps and more cost than an integrated solution.

Figure 13:
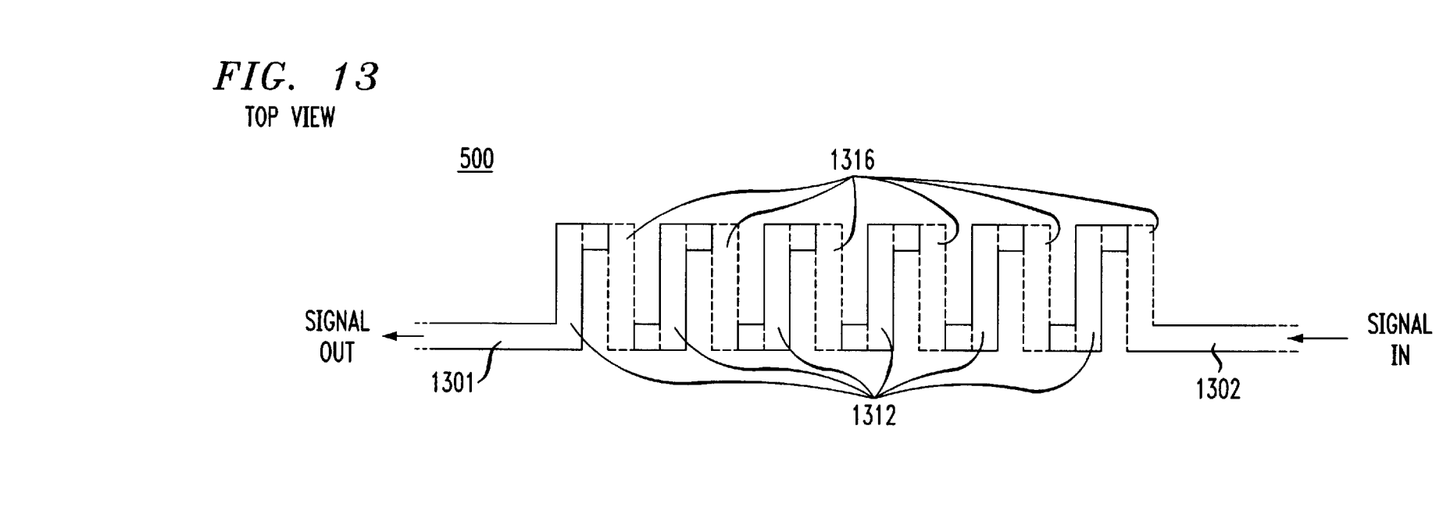
FIG. 13 depicts a plan view of a fifth embodiment of an integrated circuit in accordance with an illustrative embodiment of the present invention.
Figure 14:
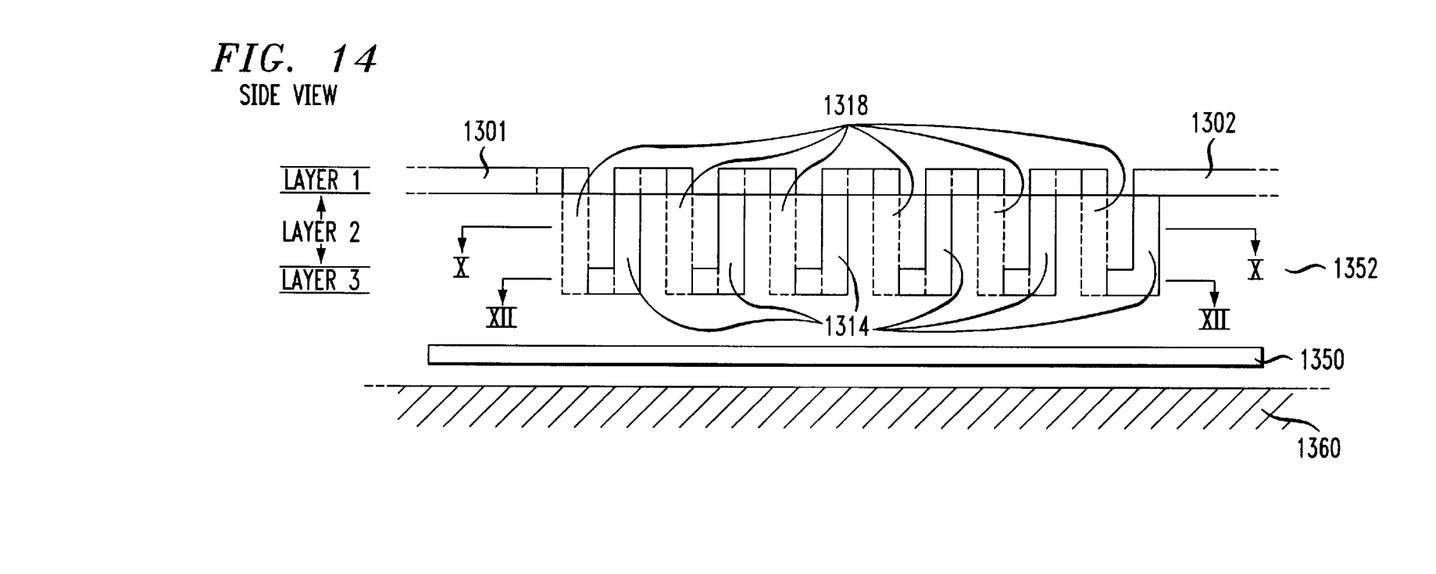
FIG. 14 depicts a side cross-sectional elevation of the integrated circuit of FIG. 13.
Figure 15:
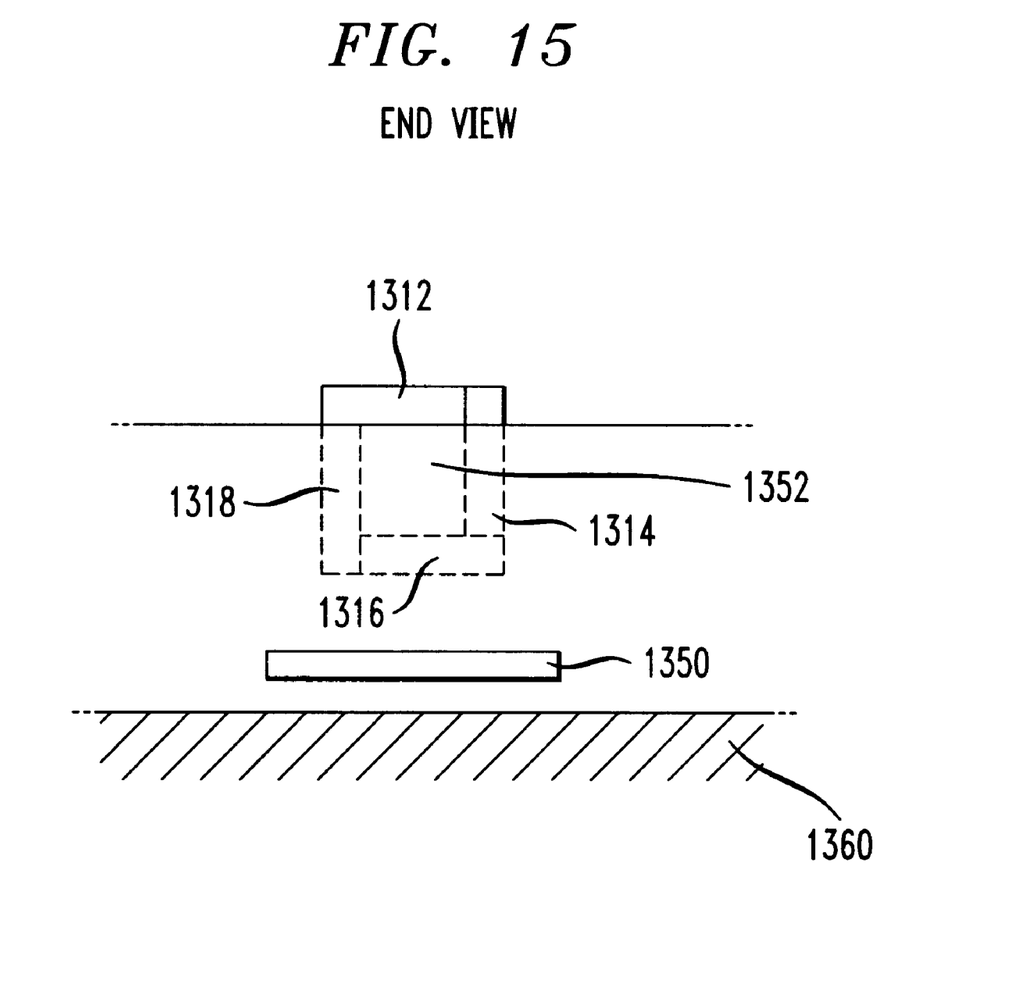
FIG. 15 depicts an end cross-sectional elevation of the integrated circuit of FIG. 13.

FIGS. 13–15 depict a fifth embodiment of an article comprising an integrated circuit 500 in accordance with the present teachings. Integrated circuit 500 comprises an integrated inductor 1300. FIG. 13 depicts a plan view of integrated circuit 500, FIG. 14 depicts a cross-sectional elevation of integrated circuit 500, and FIG. 15 depicts an end view of integrated circuit 500.

Integrated inductor 1300 is characterized by a helix of conductive material that is embedded in an insulating materials. Although inductor 1300 is depicted with six loops or turns, it will be clear to those skilled in the art how to make embodiments of the present invention with more or fewer loops. Furthermore, the helical axis of integrated inductor 1300 is parallel to the surface of substrate 1360, rather than perpendicular to it, as is common with integrated inductors in the prior art, and the various portions of integrated inductor 1300 are built-up from successive layers of conductive and insulating material. For pedagogical reasons, integrated inductor 1300 has a squared helical shape. It will be clear, however, to those skilled in the art how to make and use embodiments of the present invention that have other geometries that more or less resemble a helix.

As depicted in FIG. 13, signal lead 1301 is electrically connected to a first end of inductor 1300 and signal lead 1302 is electrically connected to a second end of inductor 1300. Also shown are top conductor 1312 and bottom conductor 1316, which form opposite sides of inductor 1300.

As depicted in FIG. 14, inductor 1300 comprises side wall conductors 1314 and 1318 that connect top conductor 1312 and bottom conductor 1316 in a helical shape. To shield inductor 1300 from substrate 1360, plate 1350 is disposed between bottom conductor 1316 and substrate layer 1360. In the illustrative embodiment depicted in FIG. 15, conductive plate 1350 is depicted as being somewhat wider than inductor 1300. Such a depiction is for purposes of clarity. It should be understood that conductive plate 1350 can be smaller or substantially larger than depicted in FIG. 2. In view of the plate's primary function of confining the electric fields emanating from inductor 1300, rather than having such electric fields terminate in (conductive) substrate 1360, the effectiveness of plate 1350 begins to substantially diminish below a certain minimum width. Below such a minimum width, a non-trivial portion of the electric fields terminate in (conductive) substrate 1360, resulting in an increase in the incidence and severity of parasitic signals in integrated circuit 500.

Suitable minimum dimensions and other considerations relevant to plate 1350 (e.g., the distance between the plate and "overlying" inductor 1300 and "underlying" substrate 1360, etc.) may be determined by those skilled in the art with the use of a software tool, such as an electromagnetic (EM) simulator. Several commercially available EM simulators are MOMENTUM™, available from Hewlett-Packard Company of Palo Alto, Calif.; IE3D™ available from Zeland Software of Frement Calif., and SONNET™, available from Sonnet Software of Liverpool, N.Y. As a "rule-of-thumb," plate 1350 should be at least about five times wider than inductor 1300.

A first layer of electrically-insulating material is disposed between top conductor 1312 and bottom conductor 1316. A second layer of electrically-insulating material is disposed between bottom conductor 1316 and "underlying" plate 1350. And a third layer of electrically-insulating material is disposed between plate 1350 and underlying substrate 1360. Such first, second and third layers of electrically-insulating material, which are not individually depicted in FIGS. 14 and 15, are collectively represented by reference numeral 1313.

It should be appreciated that in other embodiments, other confinement arrangements such as, for example, the cages and ducts previously described, may suitably be used in conjunction with inductor 1300.

It is to be understood that the above-described embodiments are merely illustrative of the invention and that many variations may be devised by those skilled in the art without departing from the scope of the invention. It is therefore intended that such variations be included within the scope of the following claims and their equivalents.

What is claimed is:

1. An integrated circuit comprising:

a first lead and a second lead that are made from a first conductive layer;

a substrate;

a first plate and a second plate that are made from a second conductive layer; and a first conductive rail that is made from said first conductive layer and that is electrically insulated from and parallel to said first lead;

a second conductive rail that is made from said first conductive layer and that is electrically insulated from and parallel to said first lead, wherein said first lead is sandwiched between said first conductive rail and said second conductive rail, and said second conductive rail is electrically connected to said first conductive rail and said first plate;

wherein said first plate is sandwiched between and electrically insulated from said first lead and said substrate, said second plate is sandwiched between and electrically insulated from said second lead and said substrate, and said first plate and said second plate are electrically connected.

2. The integrated circuit of claim 1 wherein said substrate is non-conductive.

3. The integrated circuit of claim 1 further comprising:

a first conductive trough that partially encloses said first lead, wherein said first conductive trough comprises:
    (i) a first rim that comprises said first conductive rail,
    (ii) a second rim that comprises said second conductive rail, and
    (iii) a bottom that comprises said first plate.

4. The integrated circuit of claim 3 further comprising:

a third conductive rail that is made from said first conductive layer and that is electrically insulated from and parallel to said second lead;

a fourth conductive rail that is made from said first conductive layer and that is electrically insulated from and parallel to said second lead, wherein said second lead is sandwiched between said third conductive rail and said fourth conductive rail, and said fourth conductive rail is electrically connected to said third conductive raid and said second plate.

5. The integrated circuit of claim 4 further comprising:

a second conductive trough that partially encloses said second lead, wherein said second conductive trough comprises:
    (i) a first rim that comprises said third conductive rail,
    (ii) a second rim that comprises said fourth conductive rail, and
    (iii) a bottom that comprises said second plate.

6. An article comprising:

a device having a first lead, a second lead, and a third lead, wherein said first lead, said second lead, and said third lead are made from a first conductive layer;

a substrate;

a first plate made from a second conductive layer that is between said first lead and said conductive substrate;

a first conductive rail that is made from said first conductive layer and that is electrically insulated from and parallel to said first lead;

a second conductive rail that is made from said first conductive layer and that is electrically insulated from and parallel to said first lead, wherein said first lead is sandwiched between said first conductive rail and said second conductive rail, and said second conductive rail is electrically connected to said first conductive rail and said first plate;

a second plate made from said second conductive layer that is between said second lead and said conductive substrate; and a third plate made from said second conductive layer that is between said third lead and said conductive substrate, wherein said third plate is electrically connected to said first plate and said second plate.

7. The article of claim 6 wherein said substrate is non-conductive.

* * * * *